US012803550B2

(12) United States Patent
Liu et al.

(10) Patent No.: US 12,803,550 B2
(45) Date of Patent: Nov. 17, 2026

(54) ELECTRONIC CIRCUIT

(71) Applicant: Innolux Corporation, Miaoli County (TW)

(72) Inventors: Yong-Zhi Liu, Miaoli County (TW); Lien-Hsiang Chen, Miaoli County (TW); Ming-Chun Tseng, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 34 days.

(21) Appl. No.: 18/986,704

(22) Filed: Dec. 19, 2024

(65) Prior Publication Data

US 2025/0240011 A1 Jul. 24, 2025

Related U.S. Application Data

(60) Provisional application No. 63/623,338, filed on Jan. 22, 2024.

(30) Foreign Application Priority Data

Aug. 29, 2024 (CN) ......................... 202411202031.5

(51) Int. Cl.
*H03K 17/16* (2006.01)

(52) U.S. Cl.
CPC .................................... *H03K 17/16* (2013.01)

(58) Field of Classification Search
CPC ........ H03K 3/011; G09G 3/20; G09G 3/3233; H01Q 23/00
USPC .......................................................... 327/109
See application file for complete search history.

(56) References Cited

U.S. PATENT DOCUMENTS

2016/0253958 A1* 9/2016 Ma ........................ G09G 3/3225
345/211
2016/0253959 A1* 9/2016 Sun ...................... G09G 3/3233
345/212
2016/0284269 A1* 9/2016 Sun ...................... G09G 3/3258
2016/0351121 A1* 12/2016 Kim ..................... G09G 3/3233
2019/0066598 A1* 2/2019 Kim ..................... G09G 3/3291
2019/0164491 A1* 5/2019 Kim ..................... H10K 59/131
2020/0090579 A1* 3/2020 Chen ......................... G09G 3/32
2020/0234633 A1* 7/2020 Wang ..................... G09G 3/325
2022/0114952 A1* 4/2022 Tseng ................... G09G 3/3233
2024/0388277 A1* 11/2024 Tseng ................... G09G 3/3233

* cited by examiner

*Primary Examiner* — Ryan Jager
(74) *Attorney, Agent, or Firm* — JCIPRNET

(57) ABSTRACT

An electronic circuit is provided. The electronic circuit includes an electronic element, a driving transistor, a first emitting transistor, a first reset transistor and a capacitor. The driving transistor is electrically connected to the electronic element. A power voltage is passed through the driving transistor to drive the electronic element. A first terminal of the first emitting transistor is electrically connected to the power voltage. A terminal of the first reset transistor receives the reset signal. A first terminal of the capacitor is electrically connected to a control terminal of the driving transistor. A second terminal of the capacitor is electrically connected to the first reset transistor and the first emitting transistor. When the electronic element is driven, a first terminal of the driving transistor and the first terminal of the first emitting transistor receive the power voltage.

18 Claims, 8 Drawing Sheets

ELECTRONIC CIRCUIT

CROSS-REFERENCE TO RELATED APPLICATION

This application claims the priority benefit of U.S. provisional application Ser. No. 63/623,338, filed on Jan. 22, 2024 and China patent application serial no. 202411202031.5, filed on Aug. 29, 2024. The entirety of each of the above-mentioned patent applications is hereby incorporated by reference herein and made a part of this specification.

BACKGROUND

Technical Field

The disclosure relates to an electronic circuit, and particularly to an electronic circuit with parasitic capacitance coupling compensation effect.

Description of Related Art

Please refer to FIG. 1, FIG. 1 is a schematic diagram of a known electronic circuit. The electronic circuit 10 may be an illumination circuit or a pixel circuit. The electronic circuit 10 includes a driving transistor TDR, an emitting transistor TEM and an electronic element EE. The electronic element EE may be any form of illuminating element. The driving transistor TDR, the emitting transistor TEM, and the electronic element EE are connected in series with each other. A first terminal of the driving transistor TDR receives a power supply voltage ARVDD'. A first terminal of the emitting transistor TEM is electrically connected to a second terminal of the driving transistor TDR. The electronic element EE is electrically connected between a second terminal of the emitting transistor TEM and a reference voltage ARVSS. The driving transistor TDR provides the received power supply voltage ARVDD' to the emitting transistor TEM according to a voltage value VG at a control terminal of the driving transistor TDR. The emitting transistor TEM to drives the electronic element EE using the power supply voltage ARVDD' in response to an enable signal EM.

There is a parasitic capacitance Cgd between the second terminal of the driving transistor TDR and the control terminal of the driving transistor TDR. The power supply voltage ARVDD' is lower than a reference voltage source ARVDD. Therefore, when the driving transistor TDR is turned on based on the voltage value VG, the voltage value VG is varied by a voltage value of the power supply voltage ARVDD' through the parasitic capacitance Cgd. It should be noted, a resistance value of the wiring impedance R is different for different positions of the electronic circuit 10 on a substrate. The voltage value of the power supply voltage ARVDD' received by the driving transistor TDR is also different. In other words, a result of the voltage value VG being varied is different for different positions of the electronic circuit 10 on the substrate. The above situation causes the voltage values VG of electronic circuit 10 at different positions to have different amounts of variation, thereby causing uneven illumination of the electronic element EE.

Moreover, for example, under low grayscale operation, when the enable signal EM has a duty cycle, a voltage value VA at the second terminal of the driving transistor TDR pulls down the voltage value VG through the parasitic capacitance Cgd. At this time, a transient large current flows through the emitting transistor TEM and the electronic element EE, thereby causing the electronic element EE to provide incorrect illumination under low grayscale operation.

Therefore, how to provide coupling compensation for the parasitic capacitance Cgd in the electronic circuit 10 is one of the research focuses for those skilled in the art.

SUMMARY

The disclosure is directed to an electronic circuit with parasitic capacitance coupling compensation effect.

According to an embodiment of the present disclosure, the electronic circuit includes an electronic element, a driving transistor, a first emitting transistor, a first reset transistor, and a capacitor. The driving transistor is electrically connected to the electronic element. The power supply voltage drives the electronic element through the driving transistor. The first terminal of the first emitting transistor is electrically connected to the power supply voltage. One terminal of the first reset transistor receives a reset signal. The first terminal of the capacitor is electrically connected to the control terminal of the driving transistor. The second terminal of the capacitor is electrically connected to the first reset transistor and the first emitting transistor. When the electronic element is driven, the first terminal of the driving transistor and the first terminal of the first emitting transistor receive the power supply voltage.

Based on the above, when the electronic element is driven, the first terminal of the driving transistor and the first terminal of the first emitting transistor jointly receive the power supply voltage. In this way, a capacitive coupling of a parasitic capacitance between a second terminal of the driving transistor and a control terminal of the driving transistor could be compensated by a capacitive coupling of the capacitor.

DESCRIPTION OF THE EMBODIMENTS

Figure 1:
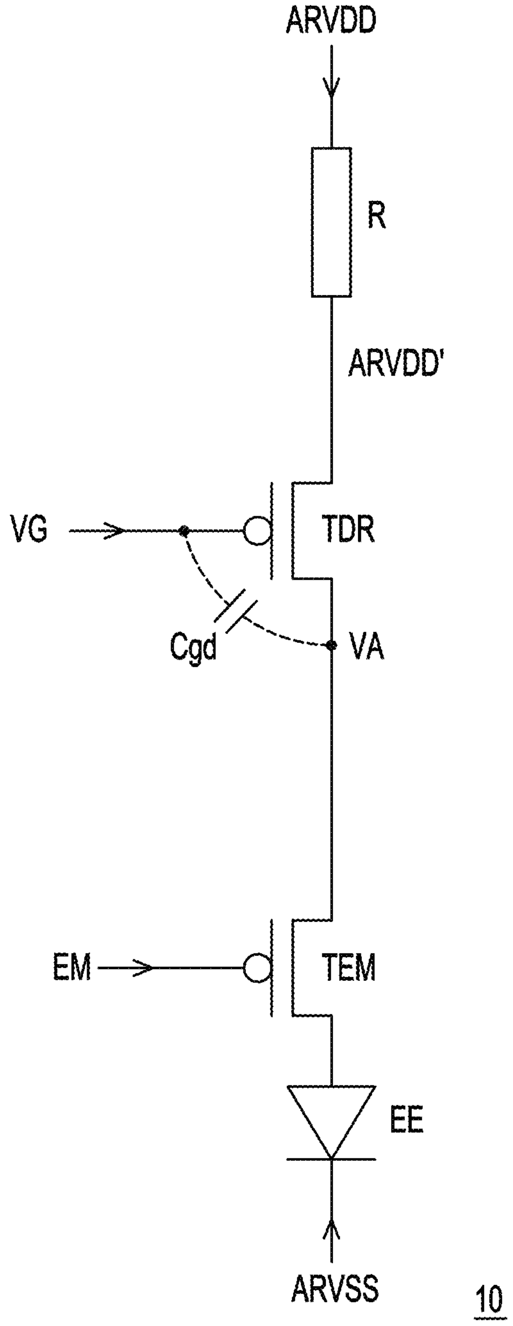
FIG. 1 (PRIOR ART)
FIG. 1 is a schematic diagram of a known electronic circuit.

The present disclosure may be understood by referring to the following detailed description in conjunction with the accompanying drawings as described below. It should be noted that, for the purpose of clear illustration and easy understanding by the reader, the various drawings in this disclosure depict a part of the electronic device, and certain elements in each drawing may not be drawn to scale. Furthermore, the number and dimensions of each device shown in the drawings are illustrative only and are not intended to limit the scope of this disclosure.

Certain terminology is used throughout the description and the following claims to refer to specific elements. As those skilled in the art will understand, electronic device manufacturers may refer to elements by different names. This document does not intend to distinguish between elements that differ in name but not in function. In the following description and in the claims, the terms "include," "including," and "have" are used in an open-ended manner, and thus should be interpreted to mean "including, but not limited to . . . ." Therefore, when the terms "include," "including," and/or "have" are used in the description of this disclosure, it will indicate the presence of corresponding features, regions, steps, operations, and/or elements, but is not limited to the presence of one or more corresponding features, regions, steps, operations, and/or elements.

It should be understood that when an element is referred to as being "coupled to," "connected to," or "in electrical communication with" another element, the element may be directly connected to the other element and may establish direct electrical connection, or there may be intermediate elements between these elements for relaying electrical connection (indirect electrical connection). In contrast, when an element is referred to as being "directly coupled to," "directly in electrical communication with," or "directly connected to" another element, there are no intermediate elements present.

Although terms such as first, second, third, etc. may be used to describe various constituent elements, these constituent elements are not limited by these terms. These terms are only used to distinguish one constituent element in the specification from other constituent elements. Claims may not use the same terminology, but may use terms such as first, second, third, etc. relative to the order in which elements are claimed. Therefore, in the following description, a first constituent element may be a second constituent element in the claims.

According to the embodiments of this disclosure, the electronic device may include a display device, a tiling device, a touch electronic device, a sensing device, an antenna device, a packaging device, a curved electronic device or a non-rectangular electronic device, but is not limited thereto. The electronic device may include, for example, liquid crystal, light-emitting diode, fluorescence, phosphor, other suitable display media, or combinations thereof, but is not limited thereto. The display device may be a non-self-emitting display device or a self-emitting display device. The electronic device may include electronic elements, which may be passive elements or active elements, such as capacitors, resistors, inductors, diodes, driving elements, transistors, etc. The diodes may include light-emitting diodes (LEDs) or photodiodes. The light-emitting diodes may include, for example, organic light-emitting diodes (OLEDs), mini LEDs, micro LEDs or quantum dot LEDs, but are not limited thereto. The tiling device may be, for example, a display tiling device, but is not limited thereto. The antenna device may be, for example, a liquid crystal antenna or a varactor diodes antenna device, but is not limited thereto.

The packaging device may be used for wafer level packaging (WLP) technology or panel level packaging (PLP) technology, such as chip first or RDL first processes. It should be noted that the electronic device may be any combination of the above, but is not limited thereto. In addition, the electronic device may be a foldable or flexible electronic device. Furthermore, the shape of the electronic device may be rectangular, circular, polygonal, with curved edges, or other suitable shapes. The electronic device may have peripheral systems such as driving systems, control systems, light source systems, layer systems, etc. to support the display device or tiling device.

In this disclosure, the embodiments use "pixel" or "pixel unit" as a unit for describing a specific area including at least one functional circuit for at least one specific function. The area of a "pixel" depends on the unit used to provide the specific function, and adjacent pixels may share the same parts or wires, but may also include their own specific parts. For example, adjacent pixels may share the same scan line or the same data line, but pixels may also have their own transistors or capacitors.

It should be noted that the technical features in the different embodiments described below may be replaced, recombined, or mixed with each other to form another embodiment without departing from the spirit of this disclosure.

Figure 2:
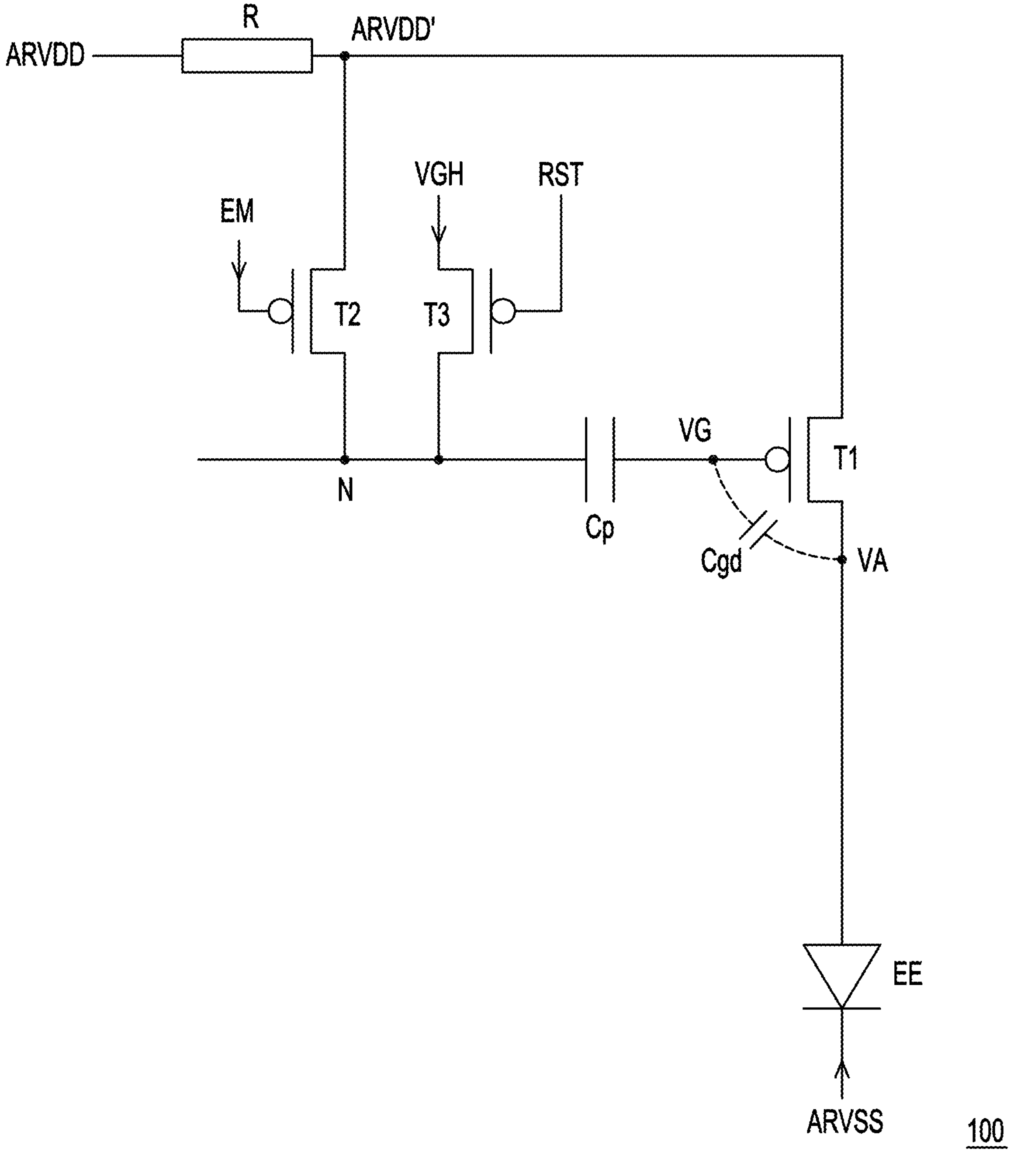
FIG. 2 is a schematic diagram of an electronic circuit illustrated according to an embodiment of the disclosure.

Please refer to FIG. 2, FIG. 2 is a schematic diagram of an electronic circuit illustrated according to an embodiment of the disclosure. In this embodiment, the electronic circuit 100 includes an electronic element EE, a driving transistor T1, a first emitting transistor T2, a first reset transistor T3 and a capacitor Cp. The driving transistor T1 is electrically connected to the electronic element. In this embodiment, the electronic circuit 100 may be, for example, an illumination circuit or a pixel circuit. The electronic element EE may be, for example, any form of illumination element, but the disclosure is not limited thereto. A first terminal of the driving transistor T1 receives a power supply voltage ARVDD'. The power supply voltage ARVDD' drives the electronic element EE through the driving transistor T1. A second terminal of the driving transistor T1 is electrically connected to the electrode of the electronic element EE. Another electrode of the electronic element EE is electrically connected to a reference voltage ARVSS.

A first terminal of the first emitting transistor T2 is electrically connected to the power supply voltage ARVDD'. One terminal of the first reset transistor T3 receives a reset signal RST. A first terminal of the capacitor Cp is electrically connected to a control terminal of the driving transistor T1. A second terminal of the capacitor Cp (that is, node N) is electrically connected to the first reset transistor T3 and the first emitting transistor T2. When the electronic element EE is driven, the first terminal of the driving transistor T1 and the first terminal of the first emitting transistor T2 receive the power supply voltage ARVDD'.

Generally, the resistance value of the wiring impedance R is varied based on a position of the electronic circuit 100 on a substrate. A voltage value of the power supply voltage ARVDD' received by the driving transistor T1 is different. In other words, a result of the voltage value VG at the control terminal of the driving transistor T1 being varied is varied depending on the position of the electronic circuit 100 on the substrate. The above situation may cause uneven illumination of the electronic element EE in multiple electronic circuits 100 at different positions. Furthermore, under low grayscale operation, when the enable signal EM has a duty cycle and the driving transistor T1 is turned on, the voltage value VA at the second terminal of the driving transistor T1 may be pulled down by the voltage value VG through a parasitic capacitor Cgd. At this time, a transient large current may flow through the electronic element EE, causing the electronic element EE to provide incorrect illumination under low grayscale operation.

It should be noted, when the electronic element EE is driven, the first terminal of the driving transistor T1 and the first terminal of the first emitting transistor T2 jointly receive the power supply voltage ARVDD'. In this way, a capacitive coupling of the parasitic capacitor Cgd between the second terminal and the control terminal of the driving transistor T1 could be compensated by a capacitive coupling of the capacitor Cp.

In this embodiment, the wiring impedance R is an equivalent resistor of the connecting line. Based on the resistance value of the wiring impedance R, the power supply voltage ARVDD' is lower than a reference voltage source ARVDD.

In this embodiment, a second terminal of the first emitting transistor T2 is electrically connected to the second terminal of the capacitor Cp. A control terminal of the first emitting transistor T2 receives an enable signal EM. The first emitting transistor T2 performs switching operations in response to a duty cycle of the enable signal EM. A first terminal of the first reset transistor T3 is electrically connected to the second terminal of the first emitting transistor T2 and the second terminal of the capacitor Cp. A second terminal of the first reset transistor T3 is electrically connected to a reference high voltage VGH. A control terminal of the first reset transistor T3 receives a reset signal RST. When the enable signal EM has a duty cycle and the driving transistor T1 is turned on, the capacitive coupling of the capacitor Cp may be generated based on the power supply voltage ARVDD'. The capacitive coupling of the parasitic capacitor Cgd may also be generated based on the power supply voltage ARVDD'. It should be noted, the capacitive coupling of the capacitor Cp may compensate (or offset) the capacitive coupling of the parasitic capacitor Cgd. In other words, compared to the capacitive coupling of the parasitic capacitor Cgd, the capacitor Cp provides an inverse capacitive coupling. The capacitive coupling of the capacitor Cp may reduce the non-ideal variation of the voltage value VG caused by the capacitive coupling of the parasitic capacitor Cgd.

In this embodiment, the capacitance value of the capacitor Cp is designed to be equal to the capacitance value of the parasitic capacitor Cgd. Therefore, the capacitive coupling of the capacitor Cp may completely offset the capacitive coupling of the parasitic capacitor Cgd.

In this embodiment, the driving transistor T1, the first emitting transistor T2, and the first reset transistor T3 are implemented by P-type transistors, respectively. However, this disclosure is not limited to this configuration. In some embodiments, the driving transistor T1, the first emitting transistor T2, and the first reset transistor T3 may be implemented by N-type transistors, respectively. However, this disclosure is not limited to this configuration.

Figure 3:
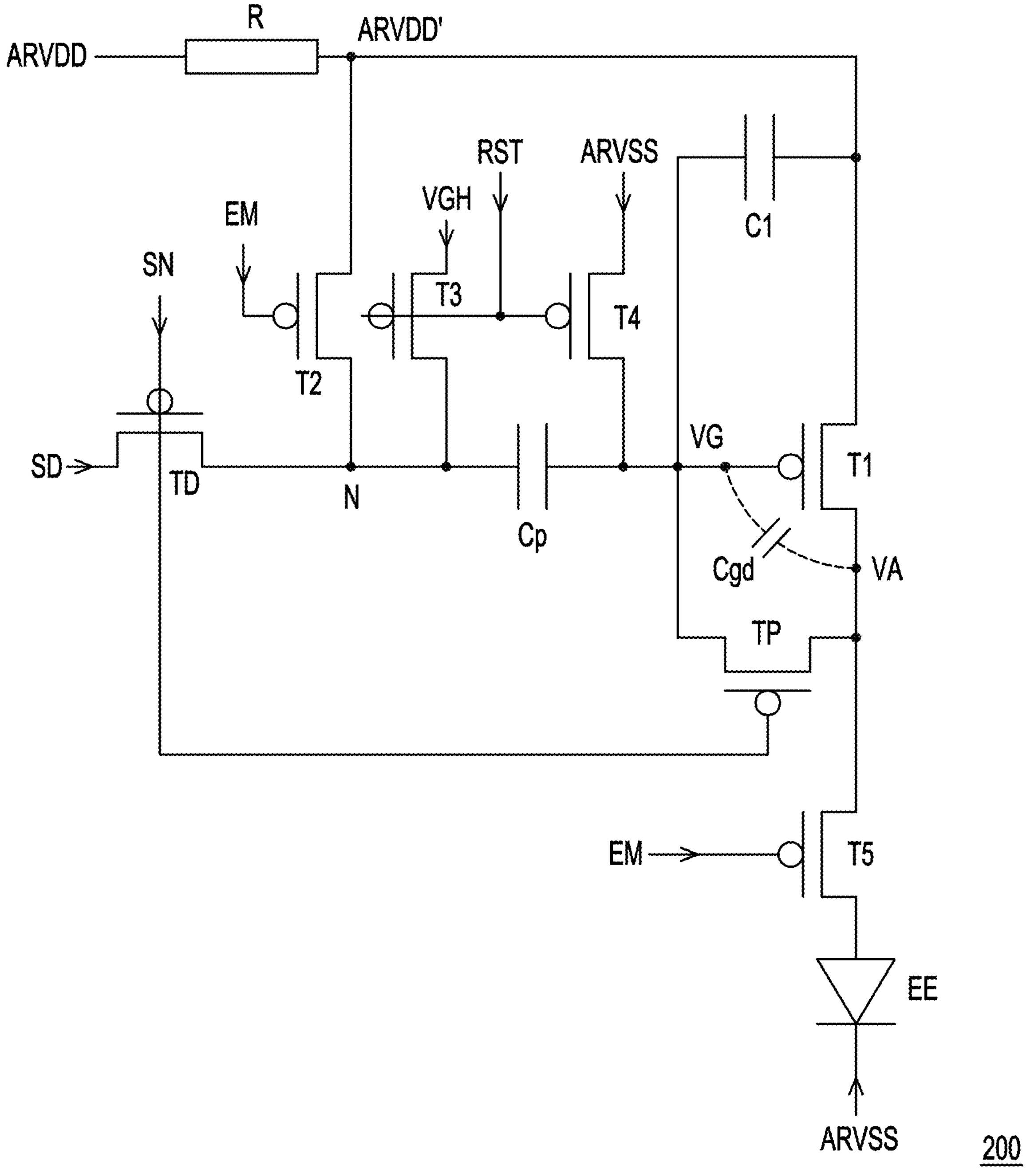
FIG. 3 is a schematic diagram of an electronic circuit illustrated according to an embodiment of the disclosure.

Please refer to FIG. 3, FIG. 3 is a schematic diagram of an electronic circuit illustrated according to an embodiment of the disclosure. In this embodiment, the electronic circuit 200 includes the electronic element EE, the driving transistor T1, the first emitting transistor T2, the first reset transistor T3, a second reset transistor T4, a second emitting transistor T5, and capacitors C1 and Cp. The first terminal of the driving transistor T1 receives a power supply voltage ARVDD'. The first terminal of the first emitting transistor T2 receives the power supply voltage ARVDD'. The second terminal of the first emitting transistor T2 is electrically connected to the second terminal of the capacitor Cp. The control terminal of the first emitting transistor T2 receives an enable signal EM. The first terminal of the first reset transistor T3 is electrically connected to the second terminal of the first emitting transistor T2 and the second terminal of the capacitor Cp. The second terminal of the first reset transistor T3 is electrically connected to a reference high voltage VGH. The control terminal of the first reset transistor T3 receives a reset signal RST. The first terminal of the capacitor Cp is electrically connected to the control terminal of the driving transistor T1. The second terminal of the capacitor Cp is electrically connected to the first terminal of the first reset transistor T3 and the second terminal of the first emitting transistor T2. The capacitor C1 is electrically connected between the first terminal of the driving transistor T1 and the control terminal of the driving transistor T1.

In this embodiment, one terminal of the second reset transistor T4 is electrically connected to the first terminal of the capacitor Cp. Another terminal of the second reset transistor T4 is electrically connected to the first reset transistor T3.

In this embodiment, for example, A first terminal of the second reset transistor T4 is electrically connected to the first terminal of the capacitor Cp. A second terminal of the second reset transistor T4 is electrically connected to a reference voltage ARVSS. A control terminal of the first reset transistor T3 and the control terminal of the second reset transistor T4 receive the reset signal RST.

In this embodiment, A first terminal of the second emitting transistor T5 is electrically connected to the second terminal of the driving transistor T1. A second terminal of the second emitting transistor T5 is electrically connected to an electrode of the electronic element EE. The control terminal of the second emitting transistor T5 receives the enable signal EM. Another electrode of the electronic element EE is electrically connected to a reference voltage ARVSS.

In this embodiment, a voltage value of the reference voltage ARVSS may be lower than or equal to 0 volts. It should be noted, the another electrode of the electronic element EE and the second terminal of the second reset transistor T4 are electrically connected to the reference voltage ARVSS. Therefore, the layout area of the electronic circuit 200 may be reduced.

In some embodiments, the second terminal of the second reset transistor T4 may be electrically connected to another reference voltage. The voltage value of said other reference voltage is lower than the voltage value of the power supply voltage ARVDD' minus a threshold voltage value of the driving transistor T1.

In this embodiment, when the enable signal EM has the duty cycle and the driving transistor T1 is turned on, the capacitive coupling of the capacitor Cp may be generated based on the power supply voltage ARVDD'. The capacitive coupling of the parasitic capacitor Cgd may also be generated based on the power supply voltage ARVDD'. The capacitive coupling of the capacitor Cp may compensate (or offset) the capacitive coupling of the parasitic capacitor Cgd.

In this embodiment, the electronic circuit 200 further includes a data transistor TD and a compensation transistor TP. A first terminal of the data transistor TD receives a data signal SD. A second terminal of the data transistor TD is electrically connected to the second terminal of the capacitor Cp. A control terminal of the data transistor TD receives a driving signal SN. A first terminal of the compensation transistor TP is electrically connected to the control terminal of the driving transistor T1. A second terminal of the compensation transistor TP is electrically connected to the second terminal of the driving transistor T1. A control terminal of the compensation transistor TP receives the driving signal SN.

In this embodiment, the driving transistor T1, the first emitting transistor T2, the first reset transistor T3, the second reset transistor T4, the second emitting transistor T5, the data transistor TD, and the compensation transistor TP are each implemented using P-type transistors. However, this disclosure is not limited to this configuration.

Figure 4:
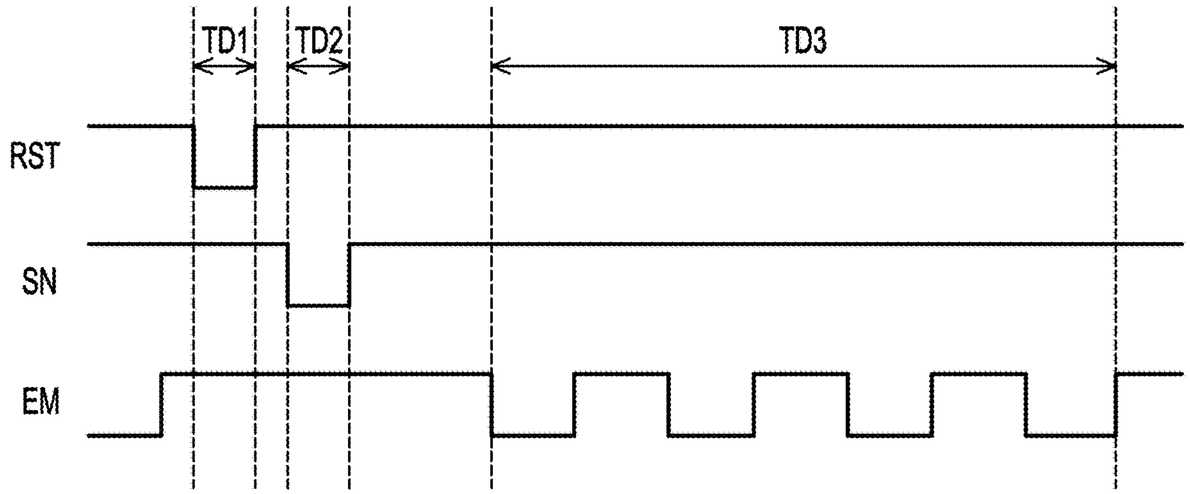
FIG. 4 is a signal timing diagram illustrated according to an embodiment of the disclosure.

Please refer to FIG. 3 and FIG. 4. FIG. 4 illustrates a signal timing diagram according to an embodiment of the disclosure. In this embodiment, during a reset period TD1, the voltage value of the reset signal RST is a low voltage level. Therefore, during the reset period TD1, the first reset transistor T3 and the second reset transistor T4 are turned on. Voltage values at both terminals of the capacitor Cp are reset. In this embodiment, for example, during the reset period TD1, the voltage value at the second terminal of the capacitor Cp is approximately equal to a voltage value of the reference high voltage VGH. The voltage value at the first terminal of the capacitor Cp is approximately equal to the voltage value of the reference voltage ARVSS. During the reset period TD1, there is a reset voltage difference (that is, "VGH-ARVSS") between the second terminal of the capacitor Cp and the first terminal of the capacitor Cp.

During the reset period TD1, the voltage values of the driving signal SN and the enable signal EM are at high voltage levels, respectively. Therefore, during the reset period TD1, the first emitting transistor T2, the second emitting transistor T5, the data transistor TD, and the compensation transistor TP are turned off. The electronic element EE does not illuminate during the reset period TD1.

In this embodiment, the voltage value of the reference high voltage VGH is higher than the highest voltage value of the data signal SD. Therefore, when the data signal SD is received, the voltage value at the second terminal of the capacitor Cp may be ensured to be pulled down during a data input period TD2, thereby enabling the control terminal of the driving transistor T1 to have information for compensating the threshold voltage value of the driving transistor T1.

During the data input period TD2, the voltage values of the reset signal RST and the enable signal EM are high voltage levels, respectively. Therefore, during the data input period TD2, the first emitting transistor T2, the first reset transistor T3, the second reset transistor T4, and the second emitting transistor T5 are turned off. The voltage value of the driving signal SN is a low voltage level. Therefore, during the data input period TD2, the data transistor TD and the compensation transistor TP are turned on. The second terminal of the capacitor Cp receives the data signal SD. The voltage value at the first terminal of the capacitor Cp is approximately equal to the voltage value of the power supply voltage ARVDD' minus the absolute value of the threshold voltage value of the driving transistor T1 (that is, "VG<ARVDD'−|Vth_T1|"). In other words, during the data input period TD2, the control terminal of the driving transistor T1 has information for compensating the threshold voltage value of the driving transistor T1.

During a driving period TD3, the voltage values of the reset signal RST and the driving signal SN are high voltage levels, respectively. Therefore, during the data input period TD2, the first reset transistor T3, the second reset transistor T4, the data transistor TD, and the compensation transistor TP are turned off. During the driving period TD3, the enable signal EM has the duty cycle. Therefore, during the driving period TD3, the first emitting transistor T2 and the second emitting transistor T5 perform switching operations in response to the duty cycle of the enable signal EM.

During the driving period TD3, when the enable signal EM has a duty cycle and the driving transistor T1 is turned on, the capacitive coupling of the capacitor Cp may compensate (or offset) the capacitive coupling of the parasitic capacitor Cgd.

Figure 5:
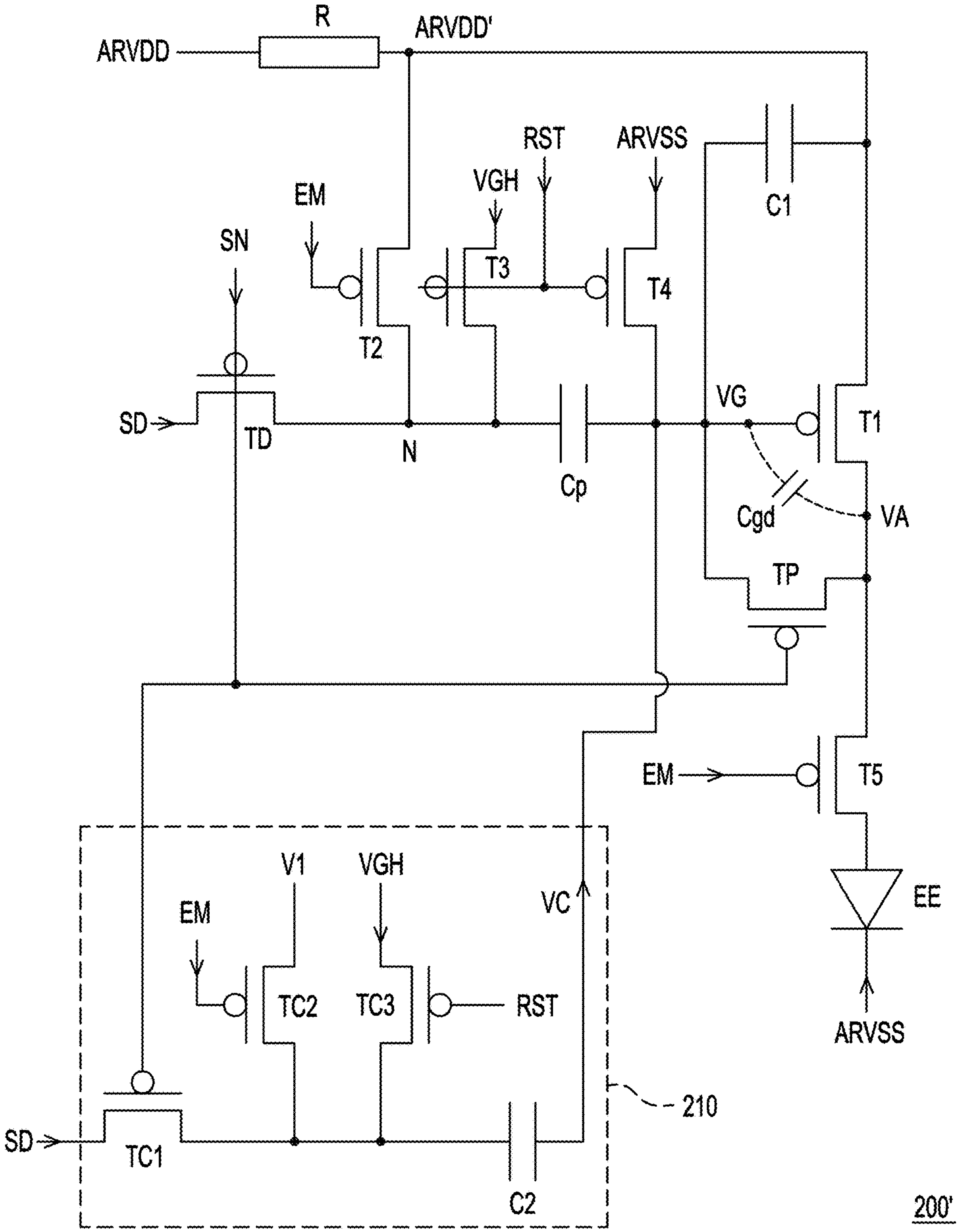
FIG. 5 is a schematic diagram of an electronic circuit illustrated according to an embodiment of the disclosure.

Please refer to FIG. 5, FIG. 5 is a schematic diagram of an electronic circuit illustrated according to an embodiment of the disclosure. In this embodiment, the electronic circuit 200' includes the electronic element EE, the driving transistor T1, the first emitting transistor T2, the first reset transistor T3, the second reset transistor T4, the second emitting transistor T5, the capacitors C1, Cp and a data control circuit 210. The embodiments of the electronic element EE, the driving transistor T1, the first emitting transistor T2, the first reset transistor T3, the second reset transistor T4, the second emitting transistor T5 and the capacitors C1, Cp have been clearly described in the embodiment of FIG. 3, and therefore will not be repeated here.

In this embodiment, the data control circuit 210 is electrically connected to the control terminal of the driving transistor T1. The data control circuit 210 generates a control voltage VC according to the data signal SD and provides the control voltage VC to the control terminal of the driving transistor T1. Therefore, the voltage value VG at the control terminal of the driving transistor T1 may be increased based on the variation of the data signal SD, which enables the range of the operating current flowing through the driving transistor T1, the second emitting transistor T5 and the electronic element EE to be increased.

In this embodiment, the data control circuit 210 includes control transistors TC1, TC2, TC3 and a capacitor C2. The first terminal of the capacitor C2 is electrically connected to the control terminal of the driving transistor T1. A first terminal of the control transistor TC1 receives the data signal SD. A second terminal of the control transistor TC1 is electrically connected to the second terminal of the capacitor C2. A control terminal of the control transistor TC1 receives the driving signal SN. A first terminal of the control transistor TC2 receives the voltage signal V1. A second terminal of the control transistor TC2 is electrically connected to the second terminal of the capacitor C2. A control terminal of the control transistor TC2 receives the enable signal EM. A first terminal of the control transistor TC3 is electrically connected to the reference high voltage VGH. A second terminal of the control transistor TC3 is electrically connected to the second terminal of the capacitor Cp. A control terminal of the control transistor TC3 receives the reset signal RST.

It should be noted, the data control circuit 210 also receives the data signal SD, the enable signal EM and the driving signal SN. Therefore, the variation of the control voltage VC follows the variation of the voltage value at the second terminal of the capacitor Cp. In this way, the amount of variation in the voltage value VG may be amplified.

In this embodiment, the control transistors TC1, TC2, TC3 are implemented by P-type transistors, respectively, but the disclosure is not limited thereto.

It should be understood that the signal timing diagram of FIG. 4 is also applicable to the electronic circuit 200'.

Figure 6:
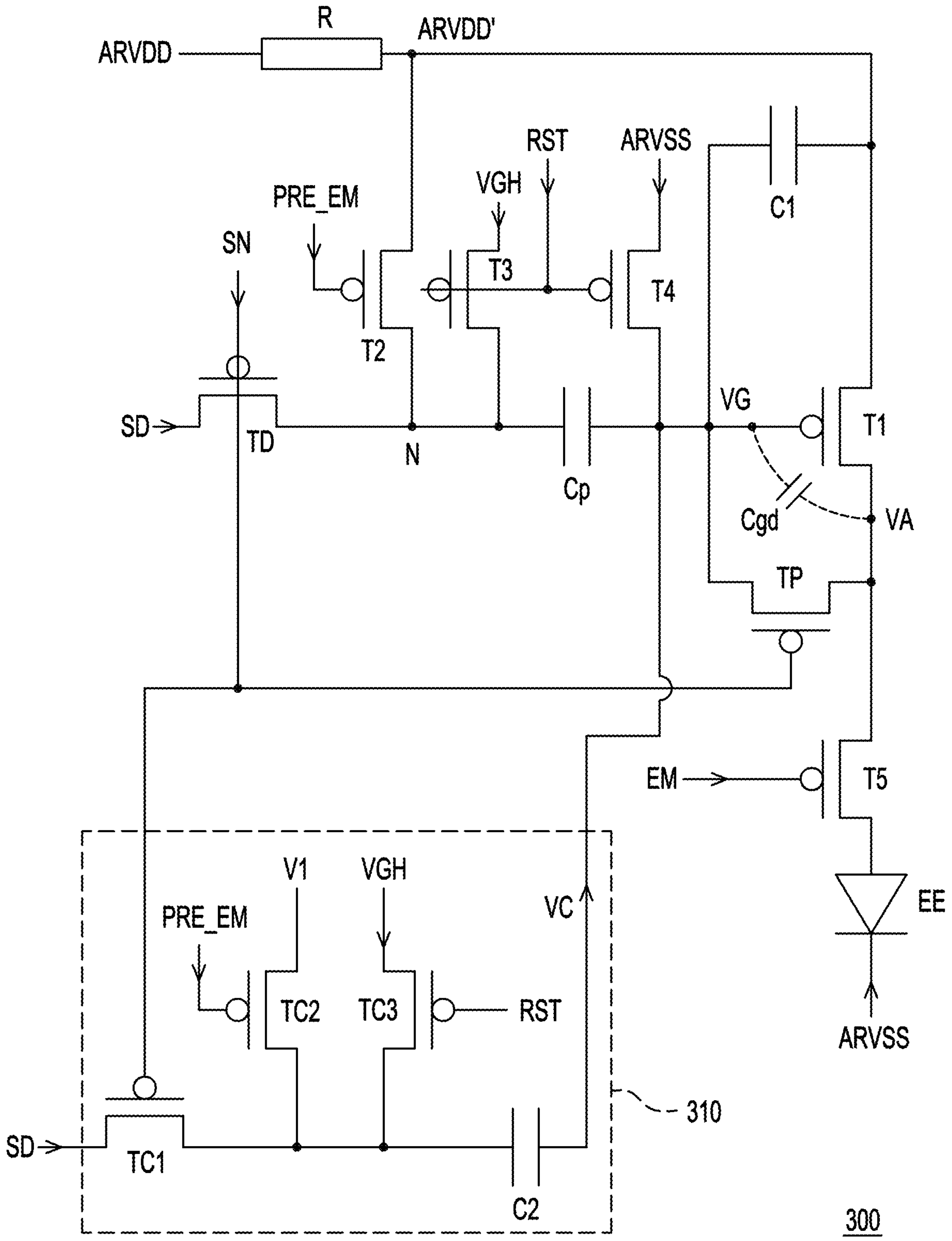
FIG. 6 is a schematic diagram of an electronic circuit illustrated according to an embodiment of the disclosure.
Figure 7:
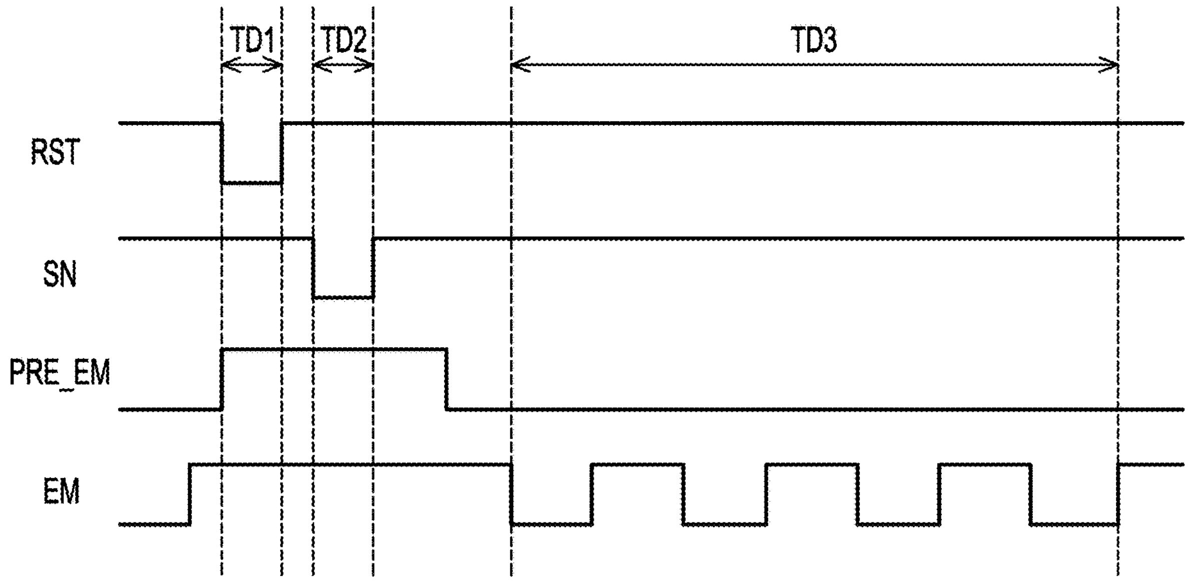
FIG. 7 is a signal timing diagram illustrated according to an embodiment of the disclosure.

Please refer to FIG. 6 and FIG. 7. FIG. 6 is a schematic diagram of an electronic circuit illustrated according to an embodiment of the disclosure. FIG. 7 is a signal timing diagram illustrated according to an embodiment of the disclosure. In this embodiment, the electronic circuit 300 includes the electronic element EE, the driving transistor T1, the first emitting transistor T2, the first reset transistor T3, the second reset transistor T4, the second emitting transistor T5, the capacitors C1, Cp, and a data control circuit 310. The data control circuit 310 includes control transistors TC1, TC2, TC3 and a capacitor C2.

Unlike the electronic circuit 200' in FIG. 5, in this embodiment of the electronic circuit 300, the control terminal of the first emitting transistor T2 and the control terminal of the control transistor TC2 receive a pre-enable signal PRE_EM respectively. After the data input period TD2 and before the driving period TD3, a voltage value of the pre-enable signal PRE_EM changes from a high level to a low level. Therefore, after the data input period TD2 and before the driving period TD3, the first emitting transistor T2 and the control transistor TC2 are turned on in response to the pre-enable signal PRE_EM. The voltage value at the second terminal of the capacitor Cp is limited to the voltage value of the power supply voltage ARVDD' firstly before the driving period TD3. Therefore, during the driving period TD3, the decrease of the voltage value VG is limited. In this way, under low grayscale operation, the decrease of the voltage value VG can be reduced by the parasitic capacitor Cgd pulled down by the voltage value VA at the second terminal of the driving transistor T1. Therefore, under low grayscale operation, there will not be a transient large current flowing through the driving transistor T1, the second emitting transistor T5, and the electronic element EE, thereby preventing the electronic element EE from providing incorrect illumination under low grayscale operation.

In some embodiments, the electronic circuit 300 may not include the data control circuit 310.

Figure 8:
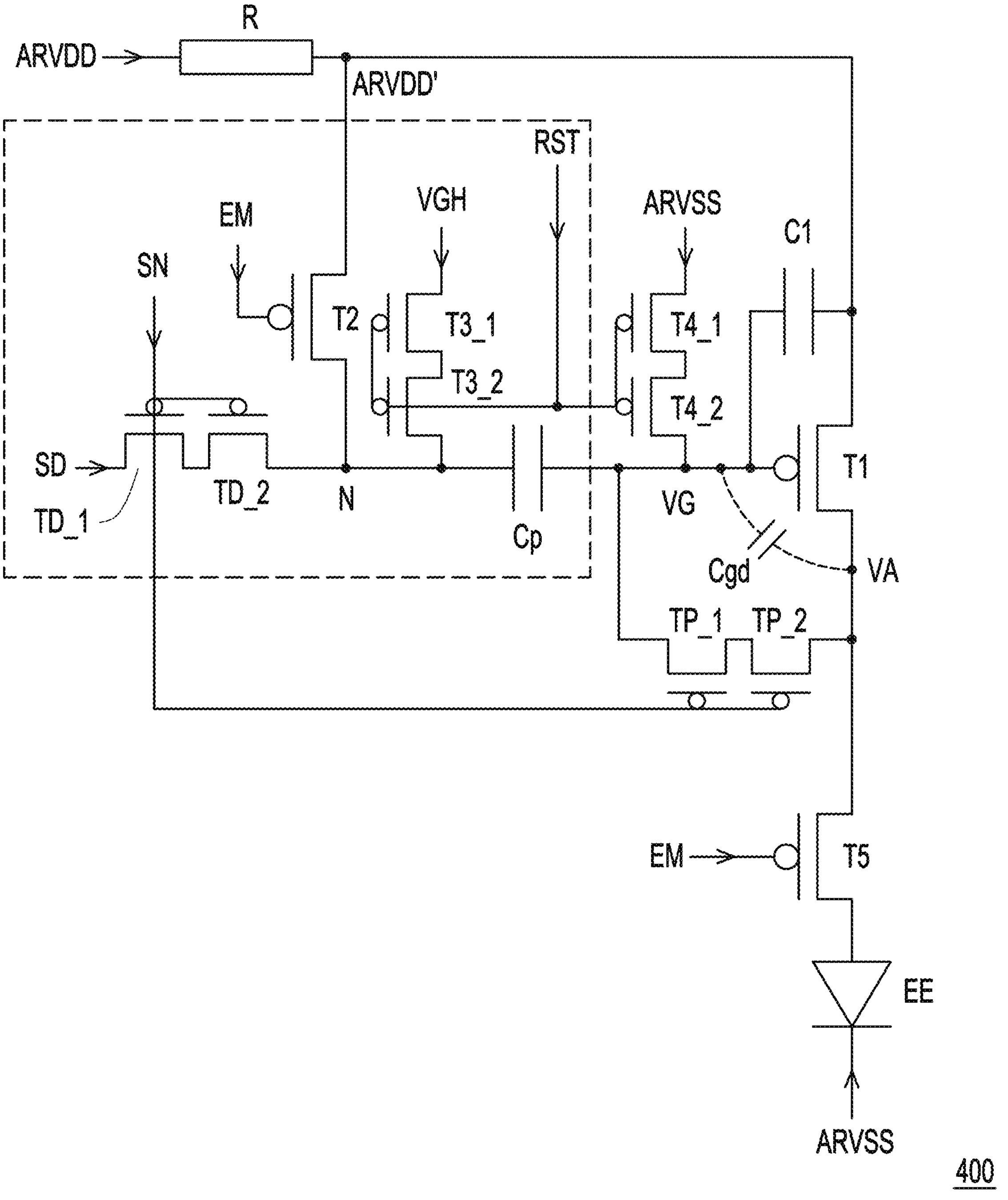
FIG. 8 is a schematic diagram of an electronic circuit illustrated according to an embodiment of the disclosure.

Please refer to FIG. 8, which is a schematic diagram of an electronic circuit illustrated according to an embodiment of the disclosure. In this embodiment, the electronic circuit 400 includes the electronic element EE, the driving transistor T1, the first emitting transistor T2, first reset transistors T3_1, T3_2, second reset transistors T4_1, T4_2, the second emitting transistor T5, the data transistors TD_1, TD_2, the compensation transistors TP_1, TP_2, and the capacitors C1, Cp. The first terminal of the driving transistor T1 receives a power supply voltage ARVDD'. The first terminal of the first emitting transistor T2 receives the power supply voltage ARVDD'. The second terminal of the first emitting transistor T2 is electrically connected to the second terminal of the capacitor Cp. The control terminal of the first emitting transistor T2 receives an enable signal EM. The first terminal of the first reset transistor T3 is electrically connected to the second terminal of the first emitting transistor T2 and the second terminal of the capacitor Cp. The first terminal of the capacitor Cp is electrically connected to the control terminal of the driving transistor T1. The capacitor C1 is electrically connected between the first terminal of the driving transistor T1 and the control terminal of the driving transistor T1.

The first terminal of the second emitting transistor T5 is electrically connected to the second terminal of the driving transistor T1. The second terminal of the second emitting transistor T5 is electrically connected to the electrode of the electronic element EE. The control terminal of the second emitting transistor T5 receives the enable signal EM. The other electrode of the electronic element EE is electrically connected to a reference voltage ARVSS.

The first reset transistors T3_1, T3_2 are connected in series between a reference high voltage VGH and the second terminal of the capacitor Cp. Control terminals of the first reset transistors T3_1, T3_2 receive a reset signal RST. In other words, the first reset transistor T3 in FIG. 3, FIG. 5, and FIG. 6 may be replaced by the first reset transistors T3_1, T3_2.

The second reset transistors T4_1, T4_2 are connected in series between the reference voltage ARVSS and the first terminal of the capacitor Cp. Control terminals of the second reset transistors T4_1, T4_2 receive the reset signal RST. In other words, the second reset transistor T4 in FIG. 3, FIG. 5, and FIG. 6 may be replaced by the second reset transistors T4_1, T4_2.

A first terminal of the data transistor TD_1 receives a data signal SD. A first terminal of the data transistor TD_2 is electrically connected to a second terminal of the data transistor TD_1. A second terminal of the data transistor TD_2 is electrically connected to the second terminal of the capacitor Cp. Control terminals of the data transistors TD_1, TD_2 receive a driving signal SN. In other words, the data transistor TD in FIG. 3, FIG. 5, and FIG. 6 may be replaced by the data transistors TD_1, TD_2.

The compensation transistors TP_1, TP_2 are connected in series between the control terminal of the driving transistor T1 and the second terminal of the driving transistor T1. Control terminals of the compensation transistors TP_1, TP_2 receive the driving signal SN. In other words, the compensation transistor TP in FIG. 3, FIG. 5, and FIG. 6 may be replaced by the compensation transistors TP_1, TP_2.

In this embodiment, the series connection configuration of the first reset transistors T3_1, T3_2, the series connection configuration of the second reset transistors T4_1, T4_2, the series connection configuration of the data transistors TD_1, TD_2, and the series connection configuration of the compensation transistors TP_1, TP_2 may reduce the leakage current of the electronic circuit 400.

In this embodiment, the driving transistor T1, the first emitting transistor T2, the first reset transistors T3_1, T3_2, the second reset transistors T4_1, T4_2, the second emitting transistor T5, the data transistors TD_1, TD_2, and the compensation transistors TP_1, TP_2 are each implemented using P-type field-effect transistors, but the disclosure is not limited thereto.

It should be understood that the signal timing diagram of FIG. 4 is also applicable to the electronic circuit 400.

It should be understood, the control transistor TC1 in FIG. 5 and FIG. 6 may be replaced by multiple control transistors connected in series with each other. The control transistor TC3 in FIG. 5 and FIG. 6 may be replaced by multiple control transistors connected in series with each other.

In view of the foregoing, when the electronic element is driven, the first terminal of the driving transistor and the first terminal of the first emitting transistor jointly receive the power supply voltage. In this way, the capacitive coupling of the parasitic capacitance located between the second terminal of the driving transistor and the control terminal of the driving transistor may be compensated by the capacitive coupling of the capacitor.

Finally, it should be noted that: the above embodiments are only used to illustrate the technical solutions of the present disclosure, and are not intended to limit them; although the present disclosure has been described in detail with reference to the foregoing embodiments, those skilled in the art should understand that: they may still modify the technical solutions described in the foregoing embodiments, or make equivalent replacements to part or all of the technical features; and these modifications or replacements do not cause the essence of the corresponding technical solutions to deviate from the scope of the technical solutions of the embodiments of the present disclosure.

What is claimed is:

1. An electronic circuit, comprising:

an electronic element;

a driving transistor, electrically connected to the electronic element, wherein a power supply voltage drives the electronic element through the driving transistor;

a first emitting transistor, a first terminal of the first emitting transistor is electrically connected to the power supply voltage;

a first reset transistor, wherein a control terminal of the first reset transistor receives a reset signal, a first terminal of the first reset transistor is electrically connected to a second terminal of the first emitting transistor, and a second terminal of the first reset transistor is electrically connected to a reference high voltage;

a capacitor, a first terminal of the capacitor is electrically connected to a control terminal of the driving transistor, and a second terminal of the capacitor is electrically connected to a first terminal of the first reset transistor and the first emitting transistor;

a data transistor, a first terminal of the data transistor receives a data signal, a second terminal of the data transistor is electrically connected to the second terminal of the capacitor, and a control terminal of the data transistor receives a driving signal; and a compensation transistor, a first terminal of the compensation transistor is electrically connected to the control terminal of the driving transistor, a second terminal of the compensation transistor is electrically connected to the second terminal of the driving transistor, and a control terminal of the compensation transistor receives the driving signal, wherein when the electronic element is driven, the first terminal of the driving transistor and the first terminal of the first emitting transistor receive the power supply voltage.

2. The electronic circuit of claim 1, wherein a voltage value of the reference high voltage is higher than a highest voltage value of the data signal.

3. The electronic circuit of claim 1, further comprising:

a second reset transistor, one terminal of the second reset transistor is electrically connected to the first terminal of the capacitor, and another terminal of the second reset transistor is electrically connected to the first reset transistor.

4. The electronic circuit of claim 3, wherein:

a first terminal of the second reset transistor is electrically connected to the first terminal of the capacitor, a second terminal of the second reset transistor is electrically connected to a reference voltage, and the control terminal of the first reset transistor and a control terminal of the second reset transistor receive the reset signal.

5. The electronic circuit of claim 1, further comprising:

a second emitting transistor, a first terminal of the second emitting transistor is electrically connected to the driving transistor, and a second terminal of the second emitting transistor is electrically connected to the electronic element.

6. The electronic circuit of claim 1, wherein:

a control terminal of the first emitting transistor receives an enable signal, and during a driving period, the first emitting transistor performs switching operations in response to a duty cycle of the enable signal.

7. The electronic circuit of claim 6, wherein when the enable signal has a duty cycle and the driving transistor is turned on, a capacitive coupling of the capacitor compensates for a capacitive coupling of a parasitic capacitance of the driving transistor.

8. The electronic circuit of claim 1, wherein a control terminal of the first emitting transistor receives a pre-enable signal, and after a data input period and before a driving period, the first emitting transistor is turned on in response to the pre-enable signal.

9. The electronic circuit of claim 1, further comprising:

a data control circuit, electrically connected to the control terminal of the driving transistor, and configured to generate a control voltage according to a data signal, and provide the control voltage to the control terminal of the driving transistor.

10. An electronic circuit, comprising:

an electronic element;

a driving transistor, electrically connected to the electronic element, wherein a power supply voltage drives the electronic element through the driving transistor;

a first emitting transistor, a first terminal of the first emitting transistor is electrically connected to the power supply voltage;

a first reset transistor, one terminal of the first reset transistor receives a reset signal;

a capacitor, a first terminal of the capacitor is electrically connected to a control terminal of the driving transistor, and a second terminal of the capacitor is electrically connected to the first reset transistor and the first emitting transistor;

a data control circuit, electrically connected to the control terminal of the driving transistor, and configured to generate a control voltage according to a data signal, and provide the control voltage to the control terminal of the driving transistor, wherein when the electronic element is driven, the first terminal of the driving transistor and the first terminal of the first emitting transistor receive the power supply voltage, wherein the data control circuit comprises:

a first control transistor, a first terminal of the first control transistor receives the data signal; and a control capacitor, a first terminal of the control capacitor is electrically connected to the first terminal of the capacitor, and a second terminal of the control capacitor is electrically connected to a second terminal of the first control transistor.

11. The electronic circuit of claim 10, wherein a control terminal of the first control transistor receives a driving signal.

12. The electronic circuit of claim 10, wherein the data control circuit further comprises:

a second control transistor, a first terminal of the second control transistor receives a voltage signal, and a second terminal of the second control transistor is electrically connected to the second terminal of the control capacitor.

13. The electronic circuit of claim 12, wherein:

a control terminal of the second control transistor receives an enable signal, and a control terminal of the first emitting transistor receives the enable signal.

14. The electronic circuit of claim 13, wherein during a driving period, the first emitting transistor and the second control transistor perform switching operations in response to a duty cycle of the enable signal.

15. The electronic circuit of claim 12, wherein:

the control terminal of the second control transistor receives a pre-enable signal, and the control terminal of the first emitting transistor receives the pre-enable signal.

16. The electronic circuit of claim 15, wherein after a data input period and before a driving period, the first emitting transistor and the second control transistor are turned on in response to the pre-enable signal.

17. The electronic circuit of claim 10, wherein the data control circuit further comprises:

a third control transistor, wherein a first terminal of the third control transistor receives a reference high voltage, and a second terminal of the third control transistor is electrically connected to the second terminal of the control capacitor.

18. The electronic circuit of claim 17, wherein a control terminal of the third control transistor receives the reset signal.

* * * * *